United States Patent
Shirley

[11] Patent Number: 5,973,974
[45] Date of Patent: Oct. 26, 1999

[54] REGRESSIVE DRIVE SENSE AMPLIFIER

[75] Inventor: Brian M. Shirley, Boise, Id.

[73] Assignee: Micro Technology, Inc., Boise, Id.

[*] Notice: This patent is subject to a terminal disclaimer.

[21] Appl. No.: 09/111,405

[22] Filed: Jul. 7, 1998

Related U.S. Application Data

[63] Continuation of application No. 08/927,360, Sep. 9, 1997, Pat. No. 5,777,937.

[51] Int. Cl.$^6$ ........................................................ G11C 7/02
[52] U.S. Cl. .......................... 365/207; 365/206; 365/205; 327/51; 327/52
[58] Field of Search ................................. 365/207, 205, 365/206, 189.09; 327/55, 51, 52; 326/85

[56] References Cited

U.S. PATENT DOCUMENTS

| | | | |
|---|---|---|---|
| 5,007,024 | 4/1991 | Tanaka et al. | 365/207 |
| 5,042,011 | 8/1991 | Casper et al. | 365/205 |
| 5,220,221 | 6/1993 | Casper | 307/530 |
| 5,394,037 | 2/1995 | Josephson et al. | 327/51 |
| 5,477,498 | 12/1995 | Ooishi | 365/205 X |
| 5,627,484 | 5/1997 | Tuminaro et al. | 327/55 |
| 5,638,333 | 6/1997 | Lee | 327/51 X |
| 5,708,616 | 1/1998 | Choi | 365/205 |
| 5,708,617 | 1/1998 | Shirley | 365/207 |
| 5,777,938 | 7/1998 | Shirley | 365/205 X |

*Primary Examiner*—Huan Hoang
*Attorney, Agent, or Firm*—Schwegman, Lundberg Woessner & Kluth P.A.

[57] ABSTRACT

A pull-down circuit in a sense amplifier, such a sense amplifier in a memory integrated circuit, includes a pull-down transistor having a drain coupled to a common node, a gate, and a source coupled to ground. An inverter provides a gate control signal to the gate of the pull-down transistor. A choke transistor has a drain coupled to a power terminal of the inverter, a gate, and source coupled to the power supply voltage. A regressive drive bias circuit is coupled to the gate of the choke transistor and provides a relatively low voltage to the gate of the choke transistor at relatively low power supply voltages resulting in a relatively large gate-to-source voltage on the choke transistor and provides a relatively high voltage to the gate of the choke transistor at relatively high power supply voltages resulting in a relatively small gate-to-source voltage on the choke transistor.

16 Claims, 6 Drawing Sheets

REGRESSIVE DRIVE SENSE AMPLIFIER

This application is a continuation of U.S. Ser. No. 08/927,360 filed Sep. 9, 1997, now U.S. Pat. No. 5,777,937.

THE FIELD OF THE INVENTION

The present invention relates generally to integrated circuits, and more particularly to sense amplifiers in memory integrated circuits, such as a dynamic random access memory (DRAM).

BACKGROUND OF THE INVENTION

In the electronics industry, integrated circuit device manufacturers design and produce commodity parts that are capable of operating in a variety of electronic systems that have different electronic specifications. For example, dynamic random access memory (DRAM) devices are designed for use in electronic systems with a wide range of power supply voltage. To keep pace with changes in system specifications, device manufacturers face the difficult task of designing new parts that operate over a wider range of conditions.

A DRAM is comprised of an array of individual memory cells. Typically, each memory cell comprises a capacitor capable of holding a charge and an access transistor for accessing the capacitor charge. The charge is representative of a data bit and can be either a high voltage or a low voltage. Data can be either stored in the memory cells during a write mode, or data may be retrieved from the memory cells during a read mode. The data is transmitted on signal lines, referred to as digit lines, which are coupled to input/output lines through transistors used as switching devices. For each bit of data stored, its true logic state is available on an I/O line and its complementary logic state is available on an I/O complement line. Thus, each memory cell has two digit lines, digit and digit complement.

Typically, the memory cells are arranged in an array and each cell has an address identifying its location in the array. The array comprises a configuration of intersecting rows and columns, and a memory cell is associated with each intersection. In order to read from or write to a cell, the particular cell must be selected, or addressed. The address for the selected cell is represented by input signals to a row decoder and to a column decoder. The row decoder activates a word line in response to the row address. The selected word line activates the access transistors for each of the memory cells in communication with the selected word line. The column decoder selects a digit line pair in response to the column address. For a read operation the selected word line activates the access transistors for a given row address, and data is latched to the digit line pairs.

Conventional DRAMs use memory cells fabricated as capacitors in an integrated circuit to store data where a logical "1" is stored as a charge on the capacitor and the capacitor is discharged for a logical "0". The pairs of digit lines are typically fabricated as metal lines on the integrated circuit and connected to the memory cells for transmitting data stored in the memory cells. Sense amplifiers are utilized to sense small differentials on the digit lines and drive the digit lines to full power supply rails for either reading or writing the memory cells.

Typically, a sense amplifier includes a pair of n-channel transistors having a cross-coupled gate and drain configuration. Due to the positive feedback of this configuration, the sense amplifier senses slight changes in the voltages on the digit and digit complement lines and produces full logic values on the digit lines based on the slight voltage differential. The source of each transistor is coupled to a pull-down circuit, which, in operation drives the source of the transistors to ground thus allowing the sense amplifier to amplify the small changes in voltage on the digit and digit complement lines.

Conventionally, the pull-down circuit of an n-channel sense amplifier comprises an n-channel MOS transistor. Unfortunately, conventional pull-down circuits do not function properly over the wider range of power supply voltages demanded by newer systems. At low supply voltages, the current in a typical pull-down circuit is not sufficient to allow the sense amplifier to settle quick enough to produce an accurate reading at the digit lines. Further, at high power supply voltages, the pull-down circuit draws too much current and drives the common source and the drains of both transistors to ground before the digit lines can reach the proper voltages.

Therefore, since current generation DRAMs rely on the analog sense amplifiers to correctly sense a small amount of stored charge in a memory cell and then amplify this charge to full digit-line voltages, the sense amplifiers are difficult to operate across a large voltage range for the power supply voltages. To aid in the operation of the sense amplifier, a current impulse that discharges a sense amplifier's common node must be carefully controlled with the pull-down circuit. If the current pulse is too small, the sense amplifier is not able to properly sense all digits in the given time period. If the current pulse is too large, the sense amplifier is essentially too strong and can corrupt data due to excessive noise and coupling mechanisms.

Therefore, for the reasons stated above, and for other reasons presented in greater detail in the Description of the Preferred Embodiments section of the present specification, there is a need in the art for a memory-integrated circuit having sense amplifier circuitry which functions properly over a wide range of power supply voltages.

SUMMARY OF THE INVENTION

The present invention provides a pull-down circuit in a sense amplifier having a common node and receiving a power supply voltage. The pull-down circuit includes a pull-down transistor having a drain coupled to the common node, a gate, and a source coupled to ground. A pull-down gate control circuit receives an input signal and includes a power terminal. The pull-down gate control circuit provides a gate control signal based on the input signal to the gate of the pull-down transistor. A choke transistor has a drain coupled to the power terminal of the pull-down gate control circuit, a gate, and source coupled to the power supply voltage. A regressive drive bias circuit is coupled to the gate of the choke transistor and provides a relatively low voltage to the gate of the choke transistor at relatively low power supply voltages resulting in a relatively large gate-to-source voltage on the choke transistor and provides a relatively high voltage to the gate of the choke transistor at relatively high power supply voltages resulting in a relatively small gate-to-source voltage on the choke transistor.

In one embodiment of the pull-down circuit according to the present invention, the regressive drive bias circuit includes first-stage and a second-stage transistor trees. The first stage transistor tree includes a first N-channel transistor having a source coupled to ground, a gate, and a drain coupled to the gate and to a first node; and a first resistive element coupled between the power supply and the first node. The second-stage transistor tree includes a first P-channel transistor having a source coupled to the power supply, a gate, and a drain coupled to the gate; a second P-channel transistor having a source coupled to the gate and drain of the first P-channel transistor, a gate coupled to the first node, and a drain coupled to the gate of the choke transistor; and a second resistive element coupled between ground and the drain of the second P-channel transistor.

In one form of the present invention, the regressive drive bias circuit of the pull-down circuit operates on the sense amplifiers of a memory integrated circuit to limit noise and bounce problems at high operating Vcc power supply voltages. Moreover, the two-stage transistor tree design of the regressive drive bias circuit permits optimal sensing at lower Vcc power supply operating voltages. The regressive drive bias circuit achieves these results by providing a higher level of instantaneous drive to the pull-down transistor at lower operating Vcc voltages and a relatively lower level of instantaneous drive to the pull-down transistor at higher operating Vcc voltages.

DESCRIPTION OF THE PREFERRED EMBODIMENTS

In the following detailed description of the preferred embodiments, reference is made to the accompanying drawings which form a part hereof, and in which is shown by way of illustration specific embodiments in which the invention may be practiced. It is to be understood that other embodiments may be utilized and structural or logical changes may be made without departing from the scope of the present invention. The following detailed description, therefore, is not to be taken in a limiting sense, and the scope of the present invention is defined by the appended claims.

The following described embodiments of the present invention are described as applied to a dynamic random access memory (DRAM). The DRAM according to the present invention is similar in many respects to conventional DRAMs, such as those commercially available from Micron Technology, Inc. of Boise, Id. For clarity, only a portion of the well known circuitry of the DRAM is described herein, while the new circuitry of the DRAM of the present invention is described in detail herein.

Figure 1:
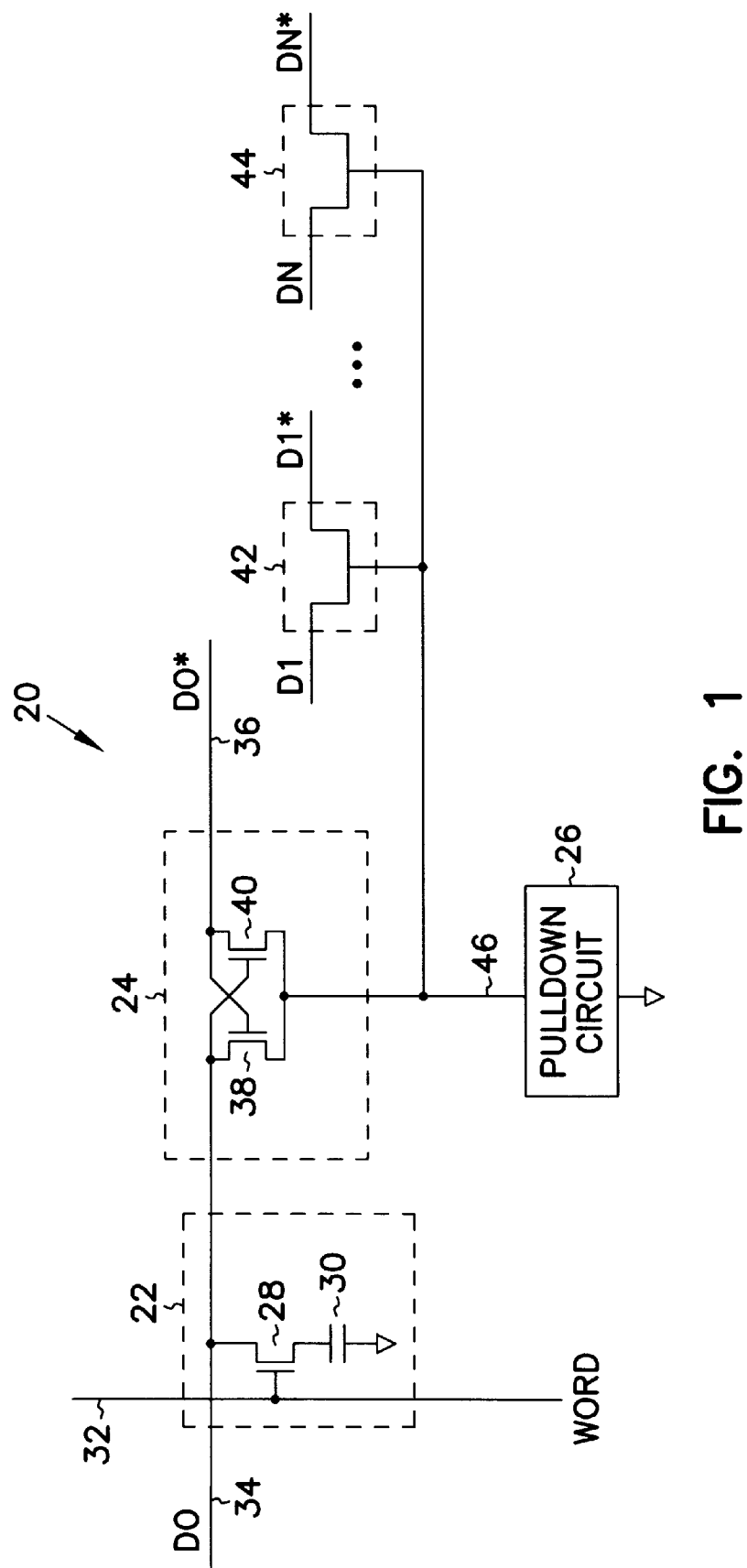
FIG. 1 is a schematic and block diagram of a portion of a dynamic random access memory (DRAM) according to the present invention.

A portion of circuitry of a DRAM configuration according to the present invention is illustrated generally at 20 in FIG. 1. A memory cell 22, which is one of numerous memory cells in a memory array of the DRAM, is coupled to a sense amplifier 24. Sense amplifier 24 is controlled by a pull-down circuit 26 according to the present invention. Memory cell 22 includes an N-channel transistor 28 and a storage capacitor 30 coupled between ground and the source of N-channel transistor 28. The gate of N-channel transistor 28 is coupled to a word line 32. The drain of N-channel transistor 28 is coupled to a digit line 34.

Word line 32 and digit line 34, along with other word and digit lines, are used to uniquely address memory cell 22 and other memory cells in the DRAM memory array. A complementary digit line 36 is either coupled to a reference voltage or senses complementary data to that stored in memory cell 22. Sense amplifier 24 includes a pair of N-channel sense amplifier transistors 38 and 40 having a cross-coupled gate and drain configuration to form the complementary digit lines 34 and 36. N-channel sense amplifier transistors 38 and 40 sense a slight charge differential between digit lines 34 and 36 resulting from the memory cells in the DRAM array. The positive feedback of the cross-coupled configuration of sense amplifier 24 amplifies the charge differential into full valid logic levels at digit lines 34 and 36.

Several sense amplifiers similar to sense amplifier 24, such as indicated at 42 and 44, are typically coupled to a common node 46 between pull-down circuit 26 and sense amplifier 24. Each sense amplifier corresponds to a column of memory cells in the DRAM memory array.

Conventional Pull-Down Circuits

Pull-down circuit 26 according to the present invention is better understood by first describing some conventional pull-down circuits. A conventional pull-down circuit typically comprises an N-channel transistor having its drain coupled to the common node and its source coupled to ground. An input signal derived from an internal sense amplifier enable signal drives the gate of the transistor, which ultimately drives the common node to ground, enabling the operation of the sense amplifier.

Figure 2:
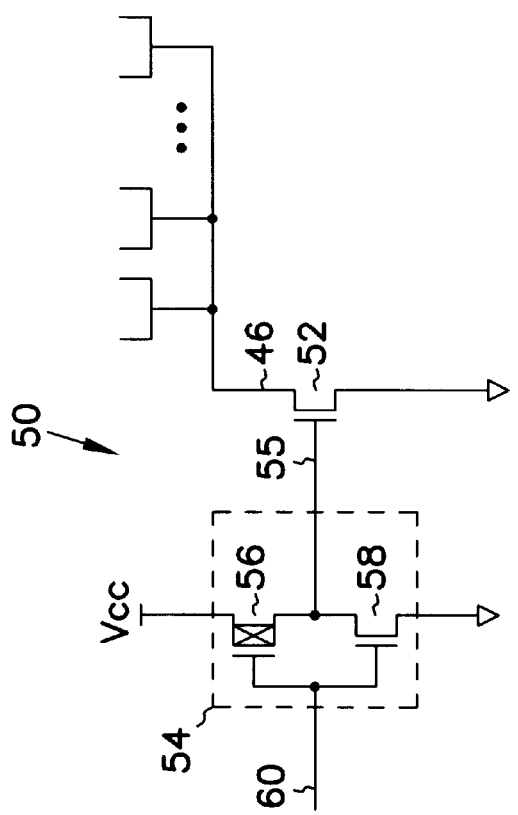
FIG. 2 is schematic diagram of a prior art pull-down circuit.

A prior art pull-down circuit is generally illustrated at 50 in FIG. 2. Pull-down circuit 50 is described in detail in the Casper et al. U.S. Pat. No. 5,042,011, which is herein incorporated by reference. Pull-down circuit 50 minimizes noise on the digit lines due to capacitive coupling through the sense amplifier by tailoring the pull-down waveform characteristic. Pull-down circuit 50 includes an N-channel pull-down transistor 52 having its drain coupled to common node 46 and its source coupled to ground. An inverter stage 54 comprises a P-channel transistor 56 and an N-channel transistor 58 having their drains coupled together and coupled to the gate of N-channel transistor 52 at a node 55. Inverter stage 54 controls the rise time of an input signal on node 55 provided to the gate of N-channel transistor 52 to tailor the pull-down waveform at node 46. The gates of transistors 56 and 58 are coupled together at a node 60 to receive an inverter input signal, which is derived from the internal DRAM sense amplifier enable signal. The source of P-channel transistor 56 is coupled to a power supply voltage (Vcc). The source of N-channel transistor 58 is coupled to ground. In operation, the weak pull-up ability of P-channel transistor 56 controls the rise time of the input signal on the gate of N-channel transistor 52, which in turn controls the time at which pull-down transistor 52 fully conducts.

Figure 3:
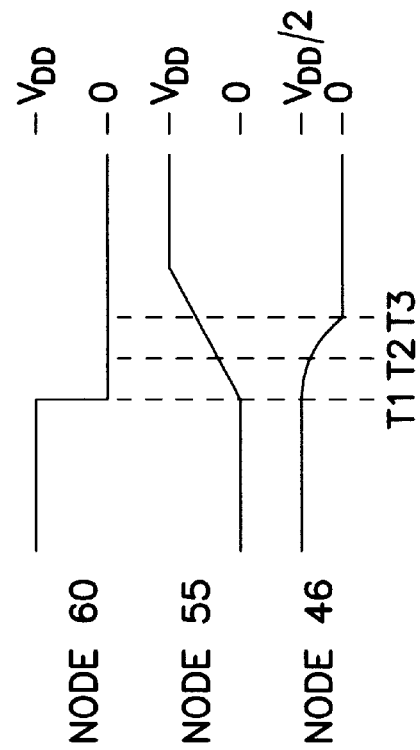
FIG. 3 is a timing diagram illustrating the operation of the prior art pull-down circuit of FIG. 2.

The operation of pull-down circuit 50 is illustrated in timing diagram form in FIG. 3, the inverter input waveform at node 60 is a negative-going step signal that initiates the action of pull-down circuit 50 at time T1. Subsequent to time T1, the signal at node 55 to the gate of transistor 52 begins to slowly rise with a rise time determined by the size of transistor 56. The pull-down waveform at node 46 correspondingly begins to slowly fall from a previously equilibrated level of Vcc/2. The initial movement of the pull-down waveform at node 46 is sufficient to enable the sense amplifier to begin charge sensing, but without an undesirable coupling of the pull-down waveform onto the digit lines. At time T2, once the digit lines begin to move slightly, the positive feedback renders the sense amplifier fully operational and establishes full logic levels on the digit lines. The full current provided by the sense amplifier flows through pull-down transistor 52, and common node 46 correspondingly quickly discharges to ground at time T3.

While the pull-down circuit 50 represents an improvement beyond a sole pull-down transistor, a problem remains when Vcc is set to voltages above 5 volts. Typically, Vcc can be set to as high as 6 volts without causing damage to the DRAM. However, at these high power supply voltages, the internal ground lines in the DRAM can move as much as 0.5 volts during a column address strobe (CAS) operation, when all of the sense amplifiers are activated. The amount of movement of the internal ground lines away from earth ground is related to the amount that the Vcc power supply is above the nominal 5 volt level. The internal ground lines can have significant resistance, thus developing an associated voltage when the charge of the digit lines is quickly discharged through the sense amplifiers. The instantaneous current flowing into the parasitic internal ground resistance, which develops the ground voltage, is proportional to the Vcc power supply voltage.

It is undesirable for the internal ground lines associated with the sense amplifiers to move away from 0 volts because other DRAM circuitry may be referenced to that ground line. For example, if an input address buffer is referenced to an internal ground line that moves to 0.5 volts during the CAS operation, data errors can result. Since the external source of read or write addresses is referenced to earth ground, a mismatch in logic levels can occur. The desired address for reading or writing data could be corrupted by the DRAM, resulting in data being written into or read from, an incorrect memory address. Other similar data errors are possible depending upon the particular DRAM architecture.

Figure 4:
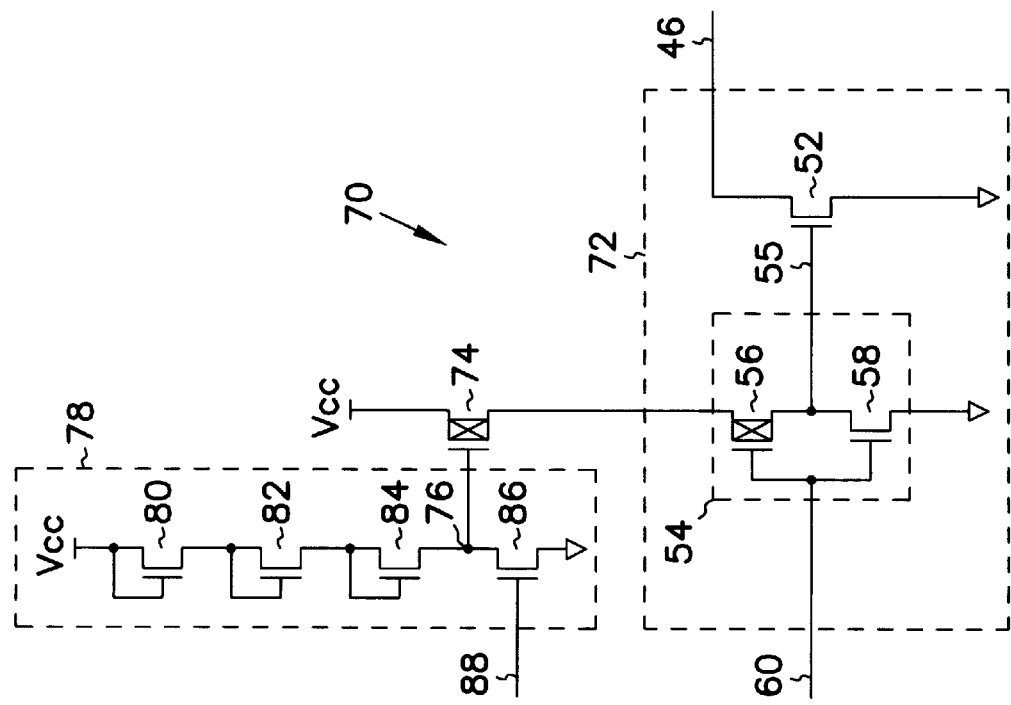
FIG. 4 is schematic diagram of a prior art pull-down circuit.

Another prior art pull-down circuit is generally indicated at 70 in FIG. 4. Pull-down circuit 70 is described in detail in the Casper U.S. Pat. No. 5,220,221, which is assigned to Micron Technology, Inc., and is herein incorporated by reference. Pull-down circuit 70 conditions the pull-down waveform at node 46 and responds to the Vcc supply voltage in order to minimize internal ground line bounce or noise.

Pull-down circuit 70 includes a pull-down circuit portion 72 similar to pull-down circuit 50 illustrated in FIG. 2. Pull-down circuit portion 72 includes N-channel pull-down transistor 52 and inverter 54 having P-channel transistor 56 and N-channel transistor 58 which are coupled together as indicated above for similar pull-down circuit 50 of FIG. 2. However, the source of transistor 56 of pull-down circuit portion 72 is not coupled to Vcc, but is instead coupled to the drain of a P-channel transistor 74. P-channel transistor 74 operates as a pull-up transistor and has its source coupled to Vcc and its gate coupled to a node 76. As will be readily apparent by the discussion below, P-channel pull-up transistor 74 operates as a current throttle or choke to the power terminal or source of transistor 56.

A bias circuit 78 is coupled to node 76 to control the gate of P-channel pull-up transistor 74. Bias circuit 78 includes diode-connected transistors 80, 82, and 84, and N-channel transistor 86. N-channel transistor 86 has its drain coupled to the gate of P-channel transistor 74. The gate of N-channel transistor 88 receives a second input which is also optionally derived from the internal sense amplifier enable signal at a node 88. The source of N-channel transistor 86 is coupled to ground. A voltage level shifter including diode-connected N-channel transistors 80, 82, and 84 has an input coupled to the Vcc supply voltage at the source of transistor 80, and an output coupled to the drain of transistor 86 at node 76. Three diode-connected transistors 80, 82, and 84 are shown in FIG. 4, but a different number can be used depending upon threshold voltages, the nominal power supply voltage, and other factors.

In operation, the rise time of the signal at node 55 is inversely proportional to the value of the power supply voltage Vcc in order to minimize internal ground line noise at higher supply voltages. The first and second input signals to pull-down circuit 70 are provided at nodes 60 and 88. The first input signal at node 60 corresponds to the input signal at node 60 in FIG. 2 or the LATCH* signal. The second input signal at node 88 is optionally a positive-going step function which has standard CMOS levels of ground and Vcc (typically 5 volts). The purpose of the input signal at node 88 is to energize the bias circuit including N-channel transistor 86 and diode-connecting transistors 80, 82, and 84. It is desirable, but not essential, that the input signal at node 88 be a step function. The gate of transistor 86 is alternatively tied to a logic 1 level. Using the step function to turn on the bias circuit saves power since the bias circuit is only enabled during, and slightly prior to, enabling the sense amplifier.

Once the bias circuit is activated by the input signal at node 88, the gate potential of transistor 74 is established. The gate potential of transistor 74 is approximately equal to Vcc−3$V_{TN}$ where $V_{TN}$ is a threshold voltage of the N-channel transistors 80, 82 and 84. Thus, the magnitude of the gate-to-source voltage of transistor 74 is set to a substantially constant voltage of 3$V_{TN}$ whenever Vcc is greater than 3$V_{TN}$. The current sourcing capability of transistor 74 remains substantially constant for the range of normal operating values of Vcc above 3$V_{TN}$.

Figure 5:
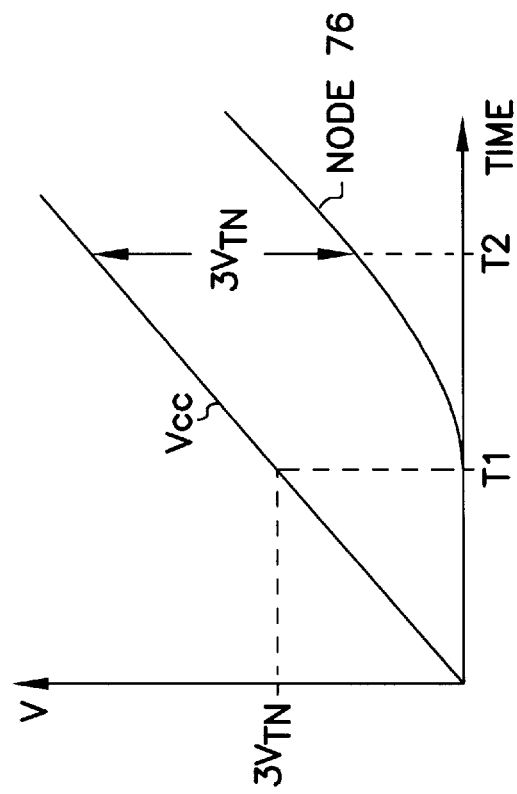
FIG. 5 is a timing diagram illustrating the operation of the prior art pull-down circuit of FIG. 4.

The operation of bias circuit 78 is illustrated in timing diagram form in FIG. 5. As illustrated in FIG. 5, the voltage at node 76 remains at ground until time T1 which corresponds to the time when the Vcc power supply voltage reaches 3$V_{TN}$ or the number of $V_{TN}$s corresponding to the number of diode-connected N-channel transistors in bias circuit 78. Thereafter, the voltage difference between node 76 and the power supply voltage Vcc remains substantially at 3$V_{TN}$ such as indicated at time T2.

Once the input signal at node 88 has switched logic states and the bias circuit 78 has stabilized, the LATCH* input signal at node 60 is employed to activate inverter 54 and pull-down transistor 52. The delay between signals at node 60 and at node 88 is ascertained by the time interval necessary to stabilize bias circuit 78. At lower Vcc voltages, such as 4 volts and assuming a typical threshold voltage $V_{TN}$ of approximately 1.5 volts, pull-down circuit 70 is essentially equivalent in structure and operation to pull-down circuit 50 of FIG. 2. When the input signal at node 88 is at a high logic level, transistor 86 is fully conducting, but, since an insufficient voltage exists across the load (i.e., transistors 80, 82, and 84), the drain of transistor 86 is at ground. Since the gate of transistor 74 is also at ground potential, it is fully conducting and the drain-to-source path of transistor 74 is essentially a short circuit for analysis purposes.

At higher Vcc voltages, such as 6 volts, the substantially constant magnitude of the gate-to-source voltage of transistor 74 acts to limit the corresponding sourced current, which also flows through transistor 56. Consequently, the slope of the input waveform at node 55 to the gate of transistor 52 is held substantially constant by the action of bias circuit 78. The operation at high Vcc levels is thus significantly different than that of pull-down circuit 50 of FIG. 2. In pull-down circuit 50, the current source by transistor 56 is a direct function of Vcc. As Vcc increases, the magnitude of the gate-to-source voltage of transistor 56 is increased with a corresponding increase in drain current. A longer time is therefore required to fully discharge the digit line with pull-down circuit 70 of FIG. 4 than with pull-down circuit 50.

Although pull-down circuit 70 achieves a lower internal ground node voltage, the time interval for discharge of the sense amplifiers is longer. While seemingly disadvantaged, it is known to those skilled in the art that the time performance of DRAMs improves as the power supply voltage is increased. Therefore, there is additional time that can be used to improve the ground noise problem, while still meeting published time specifications. For example, a typical DRAM cycle time may be 100 nanoseconds at a supply voltage of 4.5 volts, while the same cycle time may decrease to 70 nanoseconds at a supply voltage of 6 volts.

Thus, pull-down circuit 70 reduces the initial, non-enabling value of common node 46 of the sense amplifiers to a final, enabling value in response to an enable command at a rate that is generally substantially insensitive to the value of the supply voltage (Vcc) in order to minimize internal ground line noise, as well as improve DRAM performance. Nevertheless, in pull-down circuit 70, the instantaneous sense-amp current demand is still increased with higher operating voltages due to the high digit line bias voltage. In addition, pull-down circuit 70 permits a finite increase in the gate-to-source drive voltage as operating voltages are increased.

Pull-Down Circuit with Regressive Drive Bias Circuit

Figure 6A:
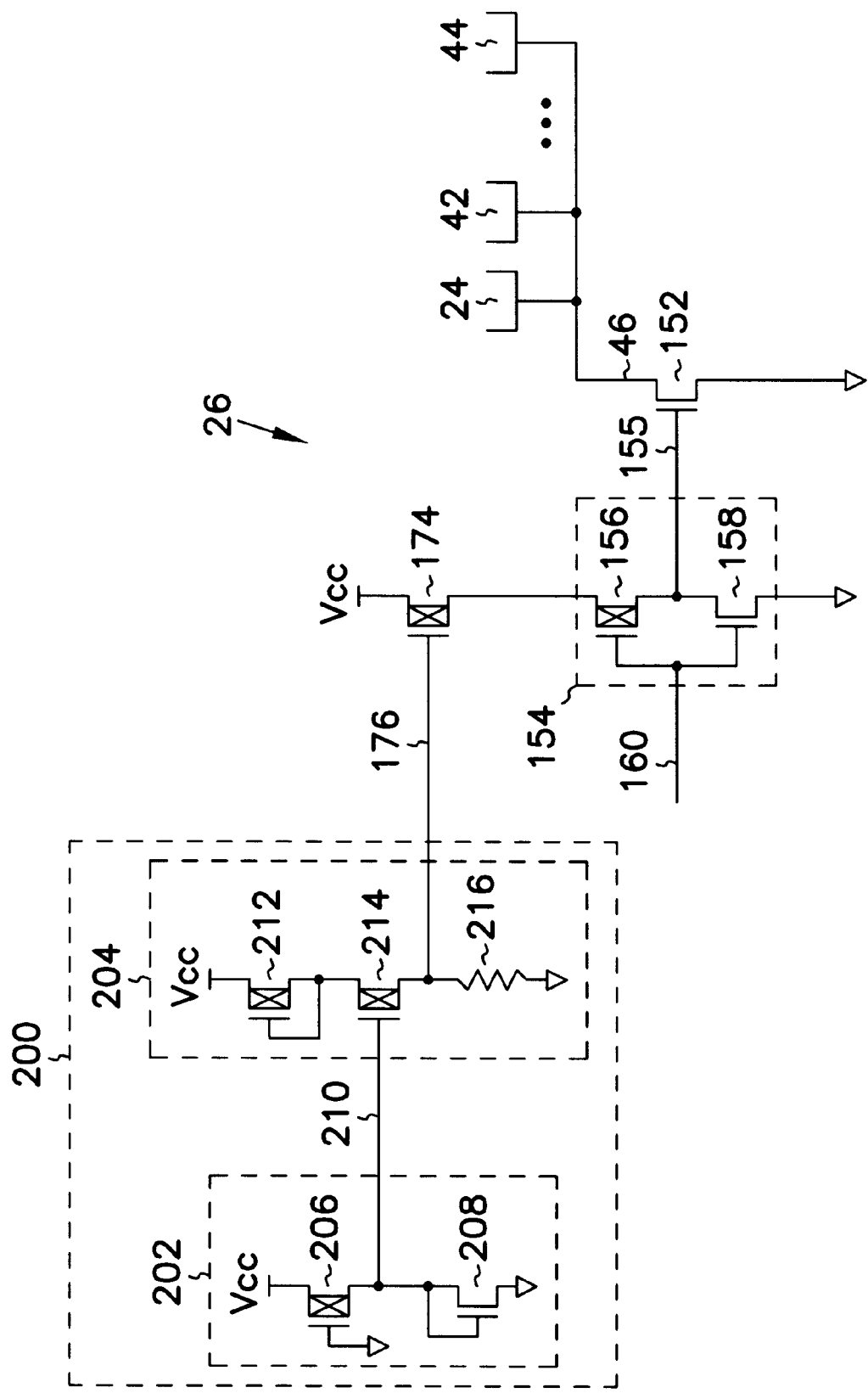
FIG. 6A is a schematic diagram of one embodiment of a pull-down circuit according to the present invention.

The pull-down circuit 26 according to the present invention is illustrated in schematic diagram form in FIG. 6A. Pull-down circuit 26 includes an N-channel pull-down transistor 152 having its drain coupled to common node 46 and its source coupled to ground. An inverter stage 154 comprises a P-channel transistor 156 and an N-channel transistor 158 having their drains coupled together and coupled to the gate of N-channel transistor 152 at a node 155. Inverter stage 154 controls the rise time of an input signal on node 155 provided to the gate of N-channel transistor 152 to tailor the pull-down waveform at node 46. The gates of transistors 156 and 158 are coupled together at a node 160 to receive an inverter input LATCH* signal, which is derived from the internal DRAM sense amplifier enable signal. The source of P-channel transistor 156 is coupled to the drain of a P-channel pull-up transistor 174. The source of N-channel transistor 158 is coupled to ground. In operation, the weak pull-up ability of P-channel transistor 156 controls the rise time of the input signal at node 155 to the gate of N-channel transistor 152, which in turn controls the time at which pull-down transistor 152 fully conducts.

P-channel transistor 174 operates as a pull-up transistor and has its source coupled to Vcc and its gate coupled to a node 176. As will be readily apparent by the discussion below, P-channel pull-up transistor 174 operates as a current throttle or choke to the power terminal or source of transistor 156. A regressive drive bias circuit 200 is coupled to node 176 to control the gate of P-channel pull-up transistor 174. Regressive drive bias circuit 200 includes a first-stage transistor tree 202 and a second-stage transistor/resistor tree 204.

First-stage transistor tree 202 includes a P-channel transistor 206 and an N-channel transistor 208. The source of P-channel transistor 206 is coupled to Vcc, the gate of P-channel transistor 206 is coupled to ground, and the drain of P-channel transistor 206 is coupled to a node 210. The source of N-channel transistor 208 is coupled to ground, and the gate and drain of N-channel transistor 208 are coupled together and coupled to node 210.

Second-stage transistor tree 204 includes a P-channel transistor 212, a P-channel transistor 214, and a resistor 216. The source of P-channel transistor 212 is coupled to Vcc, and the gate and drain of P-channel transistor 212 are coupled together and coupled to the source of P-channel transistor 214. The gate of P-channel transistor 214 is coupled to node 210 and the drain of P-channel transistor 214 is coupled to node 176. Resistor 216 is coupled between node 176 and ground.

Figure 6B:
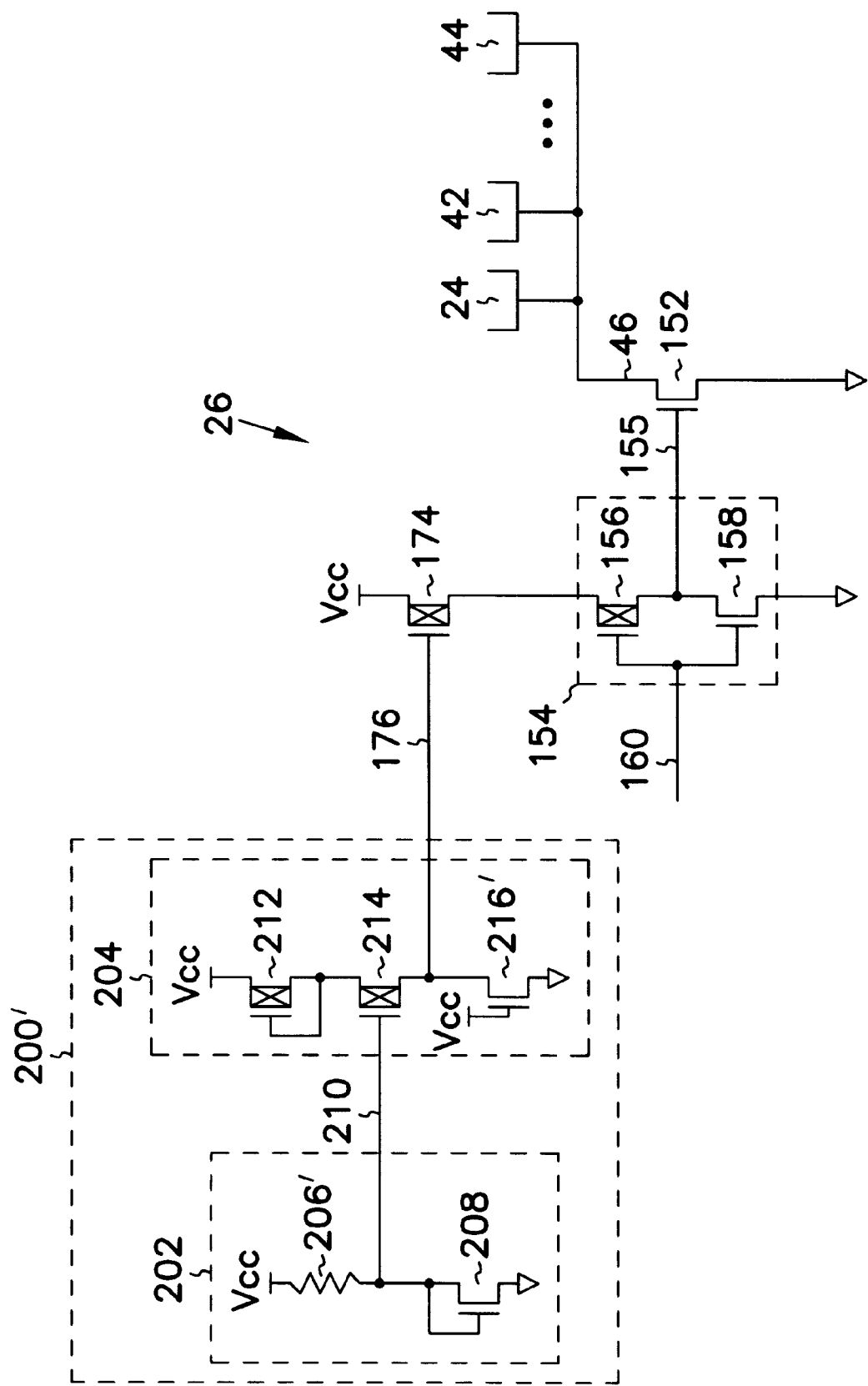
FIG. 6B is a schematic diagram of another embodiment of a pull-down circuit according to the present invention.

P-channel transistor 206 is always on as the gate of P-channel transistor 206 is tied to ground. Thus, P-channel transistor 206 operates as a resistive element and is alternatively implemented as a resistor 206', as illustrated in FIG. 6B, which illustrates an alternative embodiment regressive bias circuit 200'. Similarly, resistor 216 operates as a resistive element and is alternatively implemented as an N-channel transistor 216', as illustrated in FIG. 6B, which illustrates the regressive bias circuit 200'. The source of N-channel transistor 216' is coupled to ground, the gate of N-channel transistor 216' is coupled to Vcc, and the drain of N-channel transistor 216' is coupled to node 176. Thus, N-channel transistor 216' is always on as the gate of N-channel transistor 216' is tied to Vcc, and therefore, N-channel transistor 216' operates as a resistive element.

Figure 7:
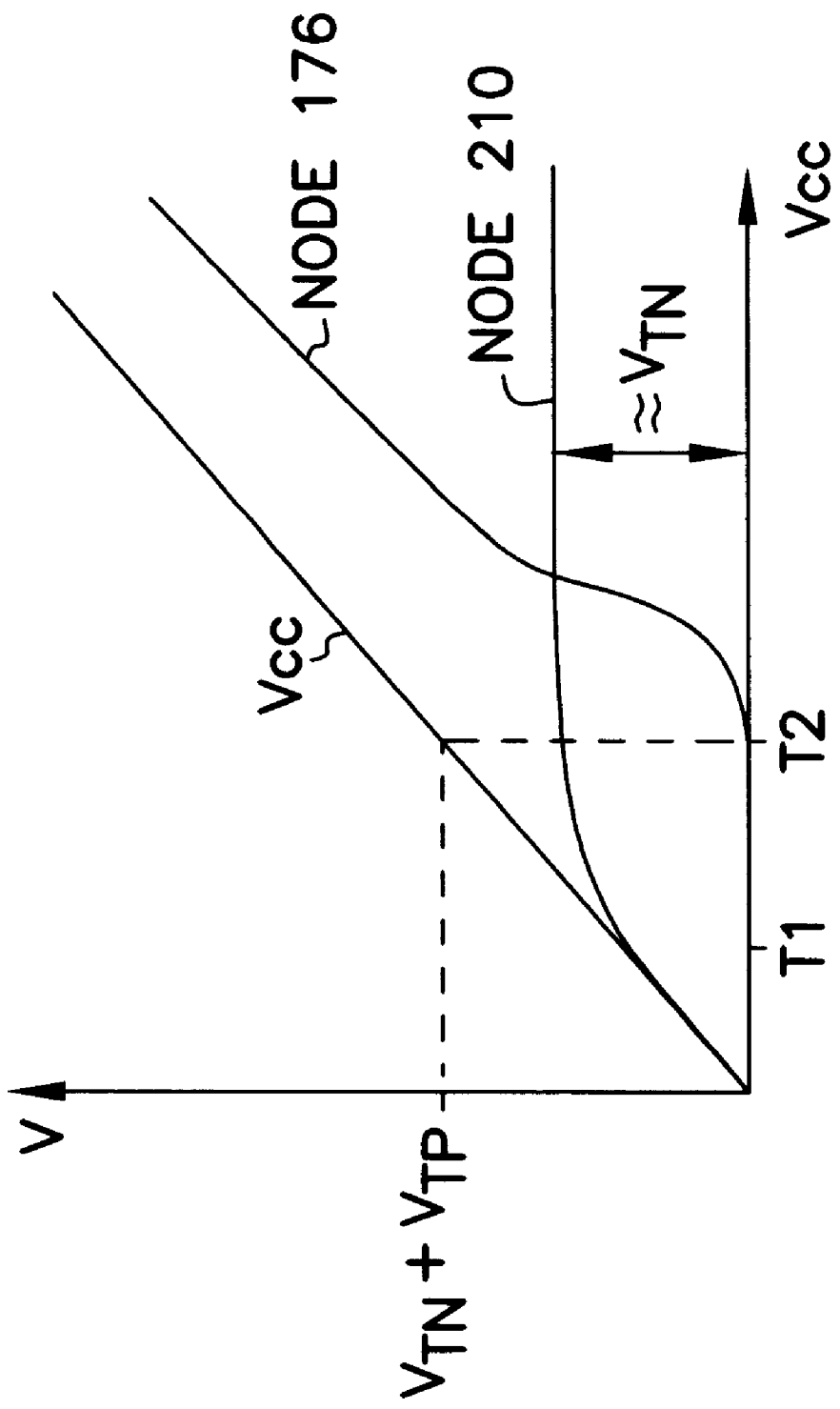
FIG. 7 is a timing diagram illustrating the operation of the pull-down circuits of FIGS. 6A and 6B.

The operation of regressive drive bias circuits 200 and 200' is illustrated in timing diagram form in FIG. 7. P-channel transistor 206 is always on as the gate of P-channel transistor 206 is tied to ground. Thus, as illustrated in FIG. 7, the voltage at node 210 tracks Vcc until time T1 when the voltage at 210 approaches $V_{TN}$, where $V_{TN}$ is a threshold voltage of N-channel transistor 208. Once $V_{TN}$ of transistor 208 is reached, node 210 remains at, or is clamped to, approximately $V_{TN}$ above ground.

The voltage at node 210 is provided to the gate of P-channel transistor 214. P-channel transistor 214 generates the voltage provided on node 176. As illustrated in FIG. 7, the voltage at node 176 remains at ground until time T2, at which point Vcc is at approximately $V_{TN}$ plus $V_{TP}$, where $V_{TP}$ represents the threshold voltage of P-channel transistor 212. After time T2, the voltage at node 176 rapidly rises to Vcc–$V_{TP}$. Thereafter, the voltage at node 176 follows Vcc and is clamped to Vcc–$V_{TP}$.

As illustrated in FIGS. 6A and 6B, the voltage at node 176 is provided to the gate of P-channel choke transistor 174. P-channel choke transistor 174 regulates the amount of current provided to inverter 154. Inverter 154 charges the gate of pull-down N-channel transistor 152, which discharges sense amplifiers 24, 42, and 44 or any other sense amplifier coupled to common node 46.

The response of node 176, as illustrated in FIG. 7, provides a relatively large gate-to-source voltage for P-channel choke transistor 174 at low Vcc power supply voltages. By contrast, at high Vcc power supply voltages, a relatively small gate-to-source voltage is created for P-channel choke transistor 174 as node 176 is clamped at Vcc–$V_{TP}$. The variance in the gate-to-source voltage of P-channel choke transistor 174 causes the slew rate of the gate of N-channel pull-down transistor 152 to be relatively high at low operating voltages of Vcc and relatively low at high operating voltages of Vcc.

In operation, at low Vcc power supply voltages, regressive drive bias circuit 200 provides little or no voltage to node 176 to drive the gate of P-channel choke transistor 174. In this way, sense amplifier 24 is provided more punch at the low power supply voltages. By contrast, at higher supply voltages, regressive drive bias circuit 200 provides higher voltages to node 176 to control the gate of choke transistor 174 to effectively clamp the drive of sense amplifier 24 by providing for less gate-to-source voltages as the difference between the gate of transistor 174 and the source of transistor 174 eventually becomes $V_{TP}$.

By using a simple CMOS inverter to drive the N-channel transistor that discharges common node 46, the prior art pull-down circuit 50 can lead to poor voltage range performance as a result of the current impulse that discharges the sense amplifier's common node being too small to thereby cause the sense amplifier to not properly sense all digits in a given time period. If the current pulse that discharges a sense amplifier's common node is too large, the sense amplifier amplifies too strongly which can corrupt data due to excessive noise and coupling mechanisms. With the design of prior art pull-down circuit 50, at high power supply levels, the drive of the pull-down transistor simply becomes too high as the gate-to-source voltage of pull-down transistor 52 becomes higher, along with the larger drain-to-source voltage resulting from the digit lines being biased to a higher value. The too large a drive of pull-down transistor 52 leads to corruption at high Vcc operating voltages.

Prior art pull-down circuit 70, illustrated in FIG. 4, solves the problem at higher operating supply voltages of Vcc by literally clamping the amount of current that charges the gate of pull-down transistor 52. Nevertheless, instantaneous sense-amp current demand increases with higher operating voltages of Vcc, and therefore, noise increases and possible corruption occurs at higher Vcc levels, because of the higher gate-to-source voltage on the sense-amp cross-coupled transistors at higher Vcc levels. In addition, the linear clamping circuitry of pull-down circuit 70 permits a finite increase in the gate-to-source drive voltage of pull-down transistor 52 as operating Vcc voltages are increased, because the clamping circuitry has a finite output resistance.

Pull-down circuit 26 of the present invention, unlike the prior art designs, actively reduces the amount of instantaneous drive from pull-down transistor 152 as operating voltages of Vcc are increased. The prior art pull-down circuits problem of the digit lines being biased to a higher value at higher operating Vcc voltages to cause relatively large drain-to-source voltages on the pull-down transistor is solved with the pull-down circuit 26 of the present invention because the increased drain-to-source voltage on pull-down transistor 152 is essentially offset by the reduced gate-to-source voltage on pull-down transistor 152. Therefore, the instantaneous drive of pull-down transistor 152 remains essentially constant for a large range in the Vcc power supply voltage.

Conclusion

The regressive drive bias circuit 200 of pull-down circuit 26 operating on the sense amplifiers of a DRAM according to the present invention limits noise and bounce problems at high operating Vcc power supply voltages. Moreover, the two-stage transistor/resistor tree design of regressive drive bias circuit 200 permits optimal sensing at lower Vcc power supply operating voltages. Regressive drive bias circuit 200 achieves these results by providing a higher level of instantaneous drive to pull-down transistor 152 at lower operating Vcc voltages and a relatively lower level of instantaneous drive to the pull-down transistor 152 at higher operating Vcc voltages.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiments shown and described without departing from the scope of the present invention. Those with skill in the mechanical, electro-mechanical, electrical, and computer arts will readily appreciate that the present invention may be implemented in a very wide variety of embodiments. This application is intended to cover any adaptations or variations of the preferred embodiments discussed herein. Therefore, it is manifestly intended that this invention be limited only by the claims and the equivalents thereof.

What is claimed is:

1. A sense amplifier receiving a power supply voltage, the sense amplifier comprising:
   a pull-down circuit having:
      a choke transistor including a source and a gate, wherein the source is in electrical communication with the power supply voltage; and
      a drive circuit coupled to the gate and providing a gate voltage to the choke transistor, wherein the drive circuit decreases the gate to source voltage on the choke transistor as the power supply voltage increases and increases the gate to source voltage on the choke transistor as the power supply voltage decreases.

2. The sense amplifier of claim 1 wherein the pull-down circuit further includes:
   an inverter having two transistors, each transistor having an inverter source, and inverter gate, and an inverter drain, wherein the inverter gates are coupled together, the inverter drains are coupled together, and the source of one of the two transistors is coupled to the choke transistor.

3. The sense amplifier of claim 2 wherein the inverter drains are coupled to an N-channel transistor.

4. The sense amplifier of claim 1 wherein the drive circuit includes transistor trees serially connected to the gate of the choke transistor, and wherein the transistor trees are connected to the power supply voltage in parallel.

5. The sense amplifier of claim 4 wherein the drive circuit includes two transistor trees.

6. The sense amplifier of claim 5 wherein one transistor tree includes at least one resistor.

7. A pull-down circuit coupled to a power supply signal and a reference voltage, the pull-down circuit comprising:
   a first stage transistor tree coupled between the power supply signal and the reference voltage;
   a second stage transistor tree coupled between the power supply signal and the reference voltage, the second stage tree electrically connected to the first stage tree; and
   a choke transistor having a source and a gate, wherein the source is coupled to the power supply signal and the gate is coupled to the second stage transistor tree;
   wherein the gate to source voltage on the choke transistor decreases as the power supply voltage increases and the gate to source voltage on the choke transistor increases as the power supply voltage decreases.

8. The pull-down circuit of claim 7 wherein the first stage transistor tree includes a pair of first stage transistors, each having a first stage drain, and wherein the first stage transistors are coupled together at the first stage drains.

9. The pull-down circuit of claim 8 wherein the first stage drains are coupled to the second stage transistor tree.

10. The pull-down circuit of claim 9 wherein the second stage transistor tree includes a pair of second stage transistors each having a second state gate and a second stage drain, the second stage transistors connected together in series and connected to a resistor.

11. The pull-down circuit of claim 10 wherein the first stage drains are couple to the second stage gate of one of the second stage transistors.

12. The pull-down circuit of claim 11 wherein the second stage drain of the one of the second stage transistors is coupled to the gate of the choke transistor.

13. A pull-down circuit receiving a power supply voltage, the pull-down circuit comprising:

a choke transistor in electrical communication with the power supply voltage; and means for decreasing gate to source voltage on the choke transistor as the power supply voltage increases and increasing the gate to source voltage on the choke transistor as the power supply voltage decreases.

14. The pull-down circuit of claim 13 wherein the choke transistor includes a source and a gate and wherein the means for decreasing includes a drive circuit coupled to the gate and providing a gate voltage to the choke transistor.

15. The pull-down circuit of claim 13 wherein the means for decreasing includes a first stage transistor tree coupled between the power supply signal and a reference voltage; and a second stage transistor tree coupled between the power supply signal and the reference voltage, the second stage tree electrically connected to the first stage tree.

16. A method of discharging a sense amplifier, the sense amplifier receiving a power supply signal, the method comprising the steps of:

generating a bias signal in response to the power supply signal;

decreasing the bias signal in response to an increase in the power supply signal; and increasing the bias signal in response to a decrease in the power supply signal.

* * * * *

UNITED STATES PATENT AND TRADEMARK OFFICE
CERTIFICATE OF CORRECTION

PATENT NO.: 5,973,974
DATED: Oct. 26, 1999
INVENTOR(S): Shirley

It is certified that error appears in the above-identified patent and that said Letters Patent is hereby corrected as shown below: On the title page: Item [73]

Assignee"s    delete "Micro" and insert --Micron--, therefor.

Signed and Sealed this

Seventh Day of November, 2000

*Attest:*

Q. TODD DICKINSON

*Attesting Officer*    *Director of Patents and Trademarks*